under: United States Patent
Meier et al.

(10) Patent No.: US 8,076,175 B2
(45) Date of Patent: Dec. 13, 2011

(54) METHOD FOR MAKING SOLAR CELL HAVING CRYSTALLINE SILICON P-N HOMOJUNCTION AND AMORPHOUS SILICON HETEROJUNCTIONS FOR SURFACE PASSIVATION

(75) Inventors: Daniel L. Meier, Atlanta, GA (US); Ajeet Rohatgi, Marietta, GA (US)

(73) Assignee: Suniva, Inc.

( * ) Notice: Subject to any disclaimer, the term of this patent is extended or adjusted under 35 U.S.C. 154(b) by 908 days.

(21) Appl. No.: 12/036,829

(22) Filed: Feb. 25, 2008

(65) Prior Publication Data
US 2009/0215218 A1  Aug. 27, 2009

(51) Int. Cl.
*H01L 21/20* (2006.01)
(52) U.S. Cl. .................. 438/96; 257/E31.043
(58) Field of Classification Search .......... 438/48, 438/57, 61–62, 96–97, 89, 87, 510, 542, 438/558–569; 136/255, 258, 261; 257/458, 257/461, 463, E31.043–E31.05
See application file for complete search history.

(56) References Cited

U.S. PATENT DOCUMENTS

| | | | |
|---|---|---|---|
| 4,019,924 A | | 4/1977 | Kurth |
| 4,100,310 A | * | 7/1978 | Ura et al. .......... 438/5 |
| 4,129,090 A | * | 12/1978 | Inaniwa et al. ......... 118/728 |
| 4,370,510 A | * | 1/1983 | Stirn ............ 136/262 |
| 4,377,723 A | | 3/1983 | Dalal |
| 4,396,793 A | | 8/1983 | Madan |
| 4,442,310 A | | 4/1984 | Carlson et al. |
| 4,451,838 A | | 5/1984 | Yamazaki |
| 4,496,788 A | | 1/1985 | Hamakawa et al. |
| 4,534,099 A | | 8/1985 | Howe |
| 4,547,622 A | | 10/1985 | Fan et al. |
| 4,591,892 A | | 5/1986 | Yamazaki |
| 4,663,495 A | | 5/1987 | Berman et al. |
| 4,672,148 A | | 6/1987 | Yamamoto et al. |

(Continued)

FOREIGN PATENT DOCUMENTS
CA        2605600       10/2006
(Continued)

OTHER PUBLICATIONS

H.C. Neitzert, et al., Stability of Silicon Based Homojunction and Heterojunction Solar Cells Under Space Conditions, Materials Science & Engineering, 2006, pp. 263-268.

(Continued)

*Primary Examiner* — Matthew W Such
*Assistant Examiner* — Ali Naraghi
(74) *Attorney, Agent, or Firm* — Alston & Bird LLP

(57) ABSTRACT

A thin silicon solar cell is described. Specifically, the solar cell may be fabricated from a crystalline silicon wafer having a thickness of approximately 50 micrometers to 500 micrometers. The solar cell comprises a first region having a p-n homojunction, a second region that creates heterojunction surface passivation, and a third region that creates heterojunction surface passivation. Amorphous silicon layers are deposited on both sides of the silicon wafer at temperatures below approximately 400 degrees Celsius to reduce the loss of passivation properties of the amorphous silicon. A final layer of transparent conductive oxide is formed on both sides at approximately 165 degrees Celsius. Metal contacts are applied to the transparent conductive oxide. The low temperatures and very thin material layers used to fabricate the outer layers of used to fabricate the outer layers of the solar cell protect the thin wafer from excessive stress that may lead to deforming the wafer.

28 Claims, 7 Drawing Sheets

U.S. PATENT DOCUMENTS

| | | | |
|---|---|---|---|
| 4,673,628 A | 6/1987 | Inoue et al. | |
| 4,709,119 A | 11/1987 | Worner | |
| 4,758,527 A | 7/1988 | Yamazaki | |
| 4,818,357 A | 4/1989 | Case et al. | |
| 4,910,153 A * | 3/1990 | Dickson | 438/96 |
| 4,948,740 A | 8/1990 | Plaettner | |
| 5,043,772 A | 8/1991 | Yamazaki | |
| 5,114,498 A | 5/1992 | Okamoto et al. | |
| 5,213,628 A | 5/1993 | Noguchi et al. | |
| 5,324,365 A | 6/1994 | Niwa | |
| 5,342,452 A | 8/1994 | Saito et al. | |
| 5,349,204 A | 9/1994 | Yamazaki | |
| 5,356,488 A * | 10/1994 | Hezel | 136/256 |
| 5,391,893 A | 2/1995 | Yamazaki | |
| 5,401,330 A | 3/1995 | Saito et al. | |
| 5,401,336 A | 3/1995 | Noguchi et al. | |
| 5,434,881 A | 7/1995 | Welsch et al. | |
| 5,437,734 A | 8/1995 | Matsushita et al. | |
| 5,453,135 A | 9/1995 | Nakagawa et al. | |
| 5,486,238 A | 1/1996 | Nakagawa et al. | |
| 5,500,055 A | 3/1996 | Toyama et al. | |
| 5,521,400 A | 5/1996 | Yamazaki | |
| 5,556,794 A | 9/1996 | Yamazaki | |
| 5,589,008 A | 12/1996 | Keppner | |
| 5,603,778 A | 2/1997 | Sonoda | |
| 5,665,175 A | 9/1997 | Safir | |
| 5,705,828 A | 1/1998 | Noguchi et al. | |
| 5,769,963 A | 6/1998 | Fujioka et al. | |
| 5,858,120 A | 1/1999 | Nakagawa et al. | |
| 5,859,397 A | 1/1999 | Ichinose et al. | |
| 5,885,725 A | 3/1999 | Toyama et al. | |
| 5,935,344 A | 8/1999 | Endo et al. | |
| 5,972,784 A | 10/1999 | Rohatgi et al. | |
| 5,981,867 A | 11/1999 | Toyama et al. | |
| 5,998,730 A | 12/1999 | Shiozaki et al. | |
| 6,028,264 A | 2/2000 | Yamazaki | |
| 6,043,105 A | 3/2000 | Yamazaki | |
| 6,043,427 A | 3/2000 | Nishimoto | |
| 6,077,722 A | 6/2000 | Jansen et al. | |
| 6,136,162 A | 10/2000 | Shiozaki et al. | |
| 6,166,318 A | 12/2000 | Freeouf | |
| 6,166,368 A | 12/2000 | Marion et al. | |
| 6,180,991 B1 | 1/2001 | Yamazaki | |
| 6,214,706 B1 | 4/2001 | Madan et al. | |
| 6,281,426 B1 | 8/2001 | Olson et al. | |
| 6,307,146 B1 | 10/2001 | Takeuchi et al. | |
| 6,346,716 B1 | 2/2002 | Yamazaki | |
| 6,413,794 B1 | 7/2002 | Sano et al. | |
| 6,427,622 B2 | 8/2002 | Madan et al. | |
| 6,465,727 B2 | 10/2002 | Maruyama et al. | |
| 6,503,771 B1 | 1/2003 | Yamazaki | |
| 6,533,904 B2 | 3/2003 | Ebisawa et al. | |
| 6,632,277 B2 * | 10/2003 | Dietze et al. | 117/2 |
| 6,664,566 B1 | 12/2003 | Yamazaki | |
| 6,670,542 B2 | 12/2003 | Sakata et al. | |
| 6,706,959 B2 | 3/2004 | Hamakawa et al. | |
| 6,878,921 B2 | 4/2005 | Taguchi et al. | |
| 7,030,413 B2 | 4/2006 | Nakamura et al. | |
| 7,041,342 B2 | 5/2006 | Lohmeyer et al. | |
| 7,164,150 B2 | 1/2007 | Terakawa et al. | |
| 7,199,395 B2 | 4/2007 | Terakawa et al. | |
| 7,214,872 B2 | 5/2007 | Maruyama et al. | |
| 7,259,322 B2 | 8/2007 | Gronet | |
| 7,947,895 B2 * | 5/2011 | Yamamoto et al. | 136/256 |
| 2002/0041443 A1 * | 4/2002 | Varaprasad et al. | 359/603 |
| 2004/0084282 A1 | 5/2004 | Hellmann et al. | |
| 2004/0112426 A1 | 6/2004 | Hagino | |
| 2004/0187911 A1 | 9/2004 | Gaudiana et al. | |
| 2005/0056312 A1 | 3/2005 | Young et al. | |
| 2005/0059186 A1 | 3/2005 | Kelly et al. | |
| 2005/0109388 A1 | 5/2005 | Murakami et al. | |
| 2005/0183767 A1 | 8/2005 | Yu et al. | |
| 2005/0250297 A1 * | 11/2005 | Shive et al. | 438/471 |
| 2005/0252544 A1 | 11/2005 | Rohatgi et al. | |
| 2006/0065297 A1 | 3/2006 | Terakawa | |
| 2006/0162763 A1 | 7/2006 | Hamakawa et al. | |
| 2006/0196535 A1 | 9/2006 | Swanson et al. | |
| 2006/0226425 A1 * | 10/2006 | Chae et al. | 257/59 |
| 2006/0255340 A1 * | 11/2006 | Manivannan et al. | 257/79 |
| 2006/0283499 A1 * | 12/2006 | Terakawa et al. | 136/258 |
| 2007/0023081 A1 * | 2/2007 | Johnson et al. | 136/258 |
| 2007/0023082 A1 | 2/2007 | Manivannan et al. | |
| 2007/0107773 A1 | 5/2007 | Fork et al. | |
| 2007/0169808 A1 | 7/2007 | Kherani et al. | |
| 2007/0207628 A1 * | 9/2007 | Chua | 438/769 |
| 2007/0272297 A1 | 11/2007 | Krivoshlykov et al. | |
| 2008/0006319 A1 | 1/2008 | Bettge et al. | |
| 2008/0223434 A1 * | 9/2008 | Ikenoue et al. | 136/252 |
| 2010/0062561 A1 * | 3/2010 | Cabarrocas et al. | 438/96 |
| 2010/0096004 A1 * | 4/2010 | Hu et al. | 136/256 |
| 2010/0263717 A1 * | 10/2010 | Wang et al. | 136/252 |

FOREIGN PATENT DOCUMENTS

| | | |
|---|---|---|
| DE | 4207783 | 3/1992 |
| EP | 0 341 756 A2 | 3/1982 |
| EP | 0 113 434 | 2/1983 |
| EP | 0 248 953 A1 | 10/1986 |
| EP | 0 265 251 | 10/1987 |
| EP | 1 852 917 A2 | 4/2004 |
| EP | 1 523 003 A1 | 9/2004 |
| FR | 2878374 | 5/2006 |
| JP | 58042279 | 3/1983 |
| JP | 61218176 | 9/1986 |
| JP | 61232685 | 10/1986 |
| JP | 63215082 | 9/1988 |
| JP | 63222471 | 9/1988 |
| JP | 1129470 | 5/1989 |
| JP | 1289173 | 11/1989 |
| JP | 2109376 | 4/1990 |
| JP | 2288369 | 11/1990 |
| JP | 3038886 | 2/1991 |
| JP | 3166771 | 7/1991 |
| JP | 4007878 | 1/1992 |
| JP | 6163957 | 6/1994 |
| JP | 6181331 | 6/1994 |
| JP | 6338623 | 12/1994 |
| JP | 7183554 | 7/1995 |
| JP | 8116080 | 5/1996 |
| JP | 9027627 | 1/1997 |
| JP | 10321889 | 12/1998 |
| JP | 11-307791 | 11/1999 |
| JP | 2001274446 | 10/2001 |
| JP | 2001308362 | 11/2001 |
| JP | 2004-221368 | 8/2004 |
| JP | 2005-268239 | 9/2005 |
| KR | 910007468 B | 9/1991 |
| WO | WO 85/05226 | 11/1985 |
| WO | WO 2004/084282 | 9/2004 |
| WO | WO 2006/111138 A1 | 10/2006 |
| WO | WO 2007/085072 | 8/2007 |
| WO | WO 2007/117153 A2 | 10/2007 |

OTHER PUBLICATIONS

L. Carnel, Thin-Film Polycrystalline Silicon Solar Cells on Ceramic Substrates With a Voc above 500 mV., 2006, pp. 21-25.

R. Muller, et al., Identification of Transport and Recombination Paths in Homo-And-Heterjunctions Silicon Solar Cells by Electrically Detected Magnetic Resonance, Journal Non-Crystalline Solid 266-269, 2000, pp. 1124-1128.

F. Rubinelli, et al., Amorphous-Crystalline Silicon Hetjunction: Theoretical Evaluation of the Current Terms, Solid State Electronics, vol. 32, No. 10, pp. 813-825, 1989.

Taguchi, et al., An Approach for the Higher Efficiency in the Hit Cells, IEEE, 2005, pp. 866-871.

G.C. Dubey, et al., Electron-Beam-Induced Current Studies of (i) ucSi :H/ Crystalline (n-+-p) Si Heterostructures, 1991, IEEE, pp. 1960-1962.

Sasaki et al., Genuine Wide-Bandgap Microcrystalline Emitter Si-HBT with Enhanced Current Gain by Suppressing Homocrystallization, 1992, IEEE, pp. 2132-2138.

Neitzert, H.C. et al., Bulk and Interface Degradation of Amorphous Silicon/Crystalline Silicon Heterojunction Solar Cells Under Proton Irradiation, 2006, IEEE, pp. 1822-1825.

L. Carnel et al., Record Voc Values for Thin-Film Polysilicon Solar Cells on Foreign Substrates Using a Heterojunction Emitter, 2006, IEEE, pp. 1449-1454.

E Centurioni et al., Junction Formation and Interface Passivation in Homojunction and Heterojunction Silicon Solar Cells Deposited BY VHF—Pecvd, 17, European Photovolaic Solar Energy Conference, Oct. 22-26, 2001, Munich, Germany, pp. 3001-3004.

Rudi Bruggemann, M. Rosch, Germany; Simulation of Amorphous Silicon Pin Diodes and Amorphous Silicon/Crystalline Silicon Heterodiode Solar Cells, Alumni Summer School 2006 Photovoltaics; pp. 149-158.

Ibrahim Ahmad Shafi Al Mohtad, Bangladesh; Numerical and Experimental Photoluminescence Studies of a-Si:H/c-Si Heterodiodes, Alumni Summer School 2006 Photovoltaics; pp. 159-181.

Taguchi et al., HIT Cells—High-Efficiency Crystalline Si Cells With Novel Structure, 2000, pp. 503-513, Progress in Photovoltaics: Research and Applications.

International Search Report from PCT/US2008/007358 dated Mar. 23, 2009.

International Search Report from PCT/US2008/007355 dated Mar. 23, 2009.

International Search Report from PCT/US2008/007356 dated Mar. 23, 2009.

International Search Report from PCT/US2008/007353 dated Mar. 23, 2009.

Office Action from corresponding U.S. Appl. No. 12/036,766 dated Jun. 10, 2010.

Machine Translation of corresponding Japanese Application No. 11307791 dated Nov. 1999.

Dupont, DuPont™ Tedlar® PVF Film, Retrieved Jan. 12, 2010 from Internet Site http://www2.dupont.com/Tedlar_PVF_Film/en_US, 1 Page Total, Dupont.

Office Action from corresponding U.S. Appl. No. 12/036,839 dated Aug. 27, 2010.

Supplemental Office Action from corresponding U.S. Appl. No. 12/036,839 dated Aug. 31, 2010.

Office Action from corresponding U.S. Appl. No. 12/036,839 dated Jan. 22, 2010.

Office Action from corresponding U.S. Appl. No. 12/036,766, dated Jan. 18, 2011.

* cited by examiner

| THERMAL OXIDE | 220 |
|---|---|
| DIFFUSED LAYER | 210 |
| DOPED SUBSTRATE | 220 |
| THERMAL OXIDE | 225 |

FIG. 3A

| DIFFUSED LAYER | 210 |
|---|---|
| DOPED SUBSTRATE | 200 |

FIG. 3B

| UNDOPED AMORPHOUS SILICON | 230 |
|---|---|
| DIFFUSED LAYER | 210 |
| DOPED SUBSTRATE | 200 |
| UNDOPED AMORPHOUS SILICON | 235 |

FIG. 3C

| DOPED AMORPHOUS SILICON | 240 |
|---|---|
| UNDOPED AMORPHOUS SILICON | 230 |
| DIFFUSED LAYER | 210 |
| DOPED SUBSTRATE | 200 |
| UNDOPED AMORPHOUS SILICON | 235 |

FIG. 3D

| DOPED AMORPHOUS SILICON | 240 |
|---|---|
| UNDOPED AMORPHOUS SILICON | 230 |
| DIFFUSED LAYER | 210 |
| DOPED SUBSTRATE | 200 |
| UNDOPED AMORPHOUS SILICON | 235 |
| DOPED AMORPHOUS SILICON | 245 |

FIG. 3E

METHOD FOR MAKING SOLAR CELL HAVING CRYSTALLINE SILICON P-N HOMOJUNCTION AND AMORPHOUS SILICON HETEROJUNCTIONS FOR SURFACE PASSIVATION

FIELD OF THE INVENTION

The present invention generally relates to silicon solar cells. More particularly, the present invention relates to a wafer structure that reduces recombination of holes and electrons at the surface, and a process that introduces less stress into thin silicon wafers to enhance their structural integrity.

BACKGROUND OF THE INVENTION

Solar cells are devices that convert light energy into electrical energy. These devices are also often called photovoltaic (PV) cells. Solar cells are manufactured from a wide variety of semiconductors. One common semiconductor material is crystalline silicon.

Solar cells have three main elements: (1) a semiconductor; (2) a semiconductor junction; and (3) conductive contacts. Semiconductors such as silicon may be doped n-type or p-type. When an n-type silicon and p-type silicon are brought together, the region in the solar cell where they meet is a semiconductor junction. The semiconductor absorbs light. The energy from the light may be transferred to the valence electron of an atom in a silicon layer, which allows the valence electron to escape its bound state leaving behind a hole. These photogenerated electrons and holes are separated by the electric field associated with the p-n junction. The conductive contacts allow current to flow from the solar cell to an external circuit.

FIG. 1 shows the basic elements of a prior art solar cell. Solar cells are fabricated on silicon wafers. The solar cell 5 comprises a p-type silicon base 10, an n-type silicon emitter 20, bottom conductive contact 40, and a top conductive contact 50. The n-type silicon 20 is coupled to the top conductive contact 50. The p-type silicon 10 is coupled to the bottom conductive contact 40. The top conductive contact 50 and the bottom conductive contact 40 are coupled to a load 75.

The top conductive contact 50, comprising silver, enables electric current to flow into the solar cell 5. The top conductive contact 50, however, does not cover the entire face of the cell 5 because silver is not transparent to light. Thus, the top conductive contact 50 has a grid pattern to allow light to enter into the solar cell 5. Electrons flow from the top conductive contact 50, and through the load 75, before uniting with holes via the bottom conductive contact 40.

The bottom conductive contact 40 usually comprises aluminum-silicon eutectic. This conductive contact 40 typically covers the entire bottom of the p-type silicon 10 in order to maximize conduction. The aluminum is alloyed with silicon at high temperatures of approximately 750 degrees Celsius, well above the aluminum-silicon eutectic temperature of 577 degrees Celsius. This alloying reaction creates a heavily-doped p-type region at the bottom of the base and gives rise to a strong electric field there. This field aids the field associated with the p-n junction in separating electrons from holes so that electrons are collected at the top contact and holes are collected at the bottom contact.

SUMMARY OF THE INVENTION

A solar cell structure that comprises a p-n homojunction and heterojunction surface passivation is provided for reducing the loss of electrons and holes by recombination at the surface, and for reinforcing an internal electric field of the p-n homojunction. A fabrication process compatible for manufacturing this solar cell on thin crystalline silicon wafers is provided. In an embodiment, a plurality of solar cells having a p-n homojunction and heterojunction surface passivation are connected in series, and are coupled to a transparent encapsulating material and to a reflective material.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present disclosure, as defined solely by the claims, will become apparent in the non-limiting detailed description set forth below.

BRIEF DESCRIPTION OF THE DRAWINGS

FIGS. 3A to 3F are cross sectional views for one embodiment of a silicon wafer at each stage in the fabrication process.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components, and circuits have not been described in detail so as not to obscure the present invention.

Solar energy is an ideal resource because it is clean and reliable. However, one impediment to achieving greater use of solar energy heretofore is the cost of solar collection systems. Approximately 75% of the cost of manufacturing silicon solar cells is in the cost of the silicon wafer itself. Thus, in theory, the more wafers that can be sliced from an ingot, the more cost savings may be realized. However, thinner wafers typically suffer reduced yield. Further, thinner wafers are subject to deformation if exposed to non-uniform high temperatures during the manufacturing process and to stresses from other layers on the silicon wafer, particularly from the aluminum-silicon eutectic layer.

Figure 1:
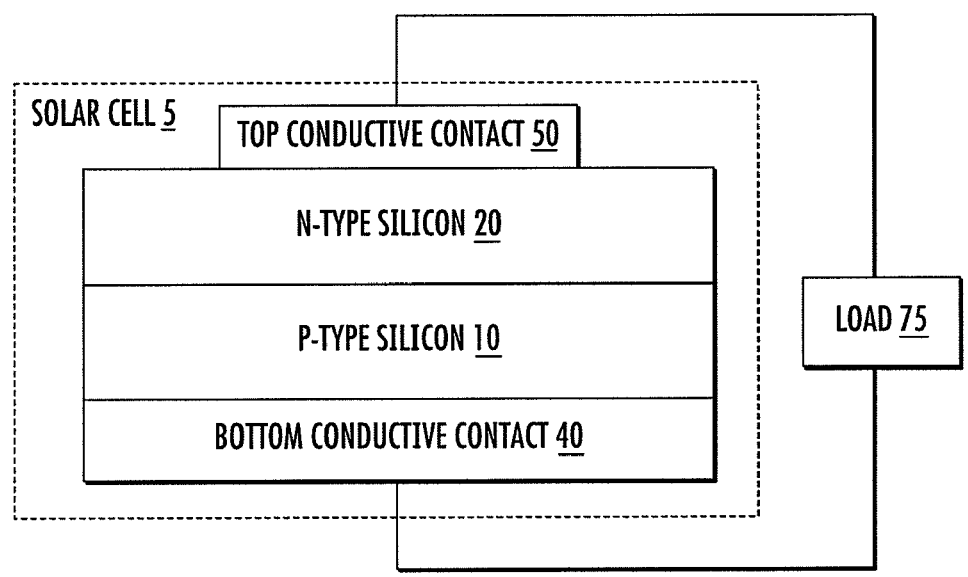
FIG. 1 is the cross-sectional view of a prior art solar cell.
Figure 2:
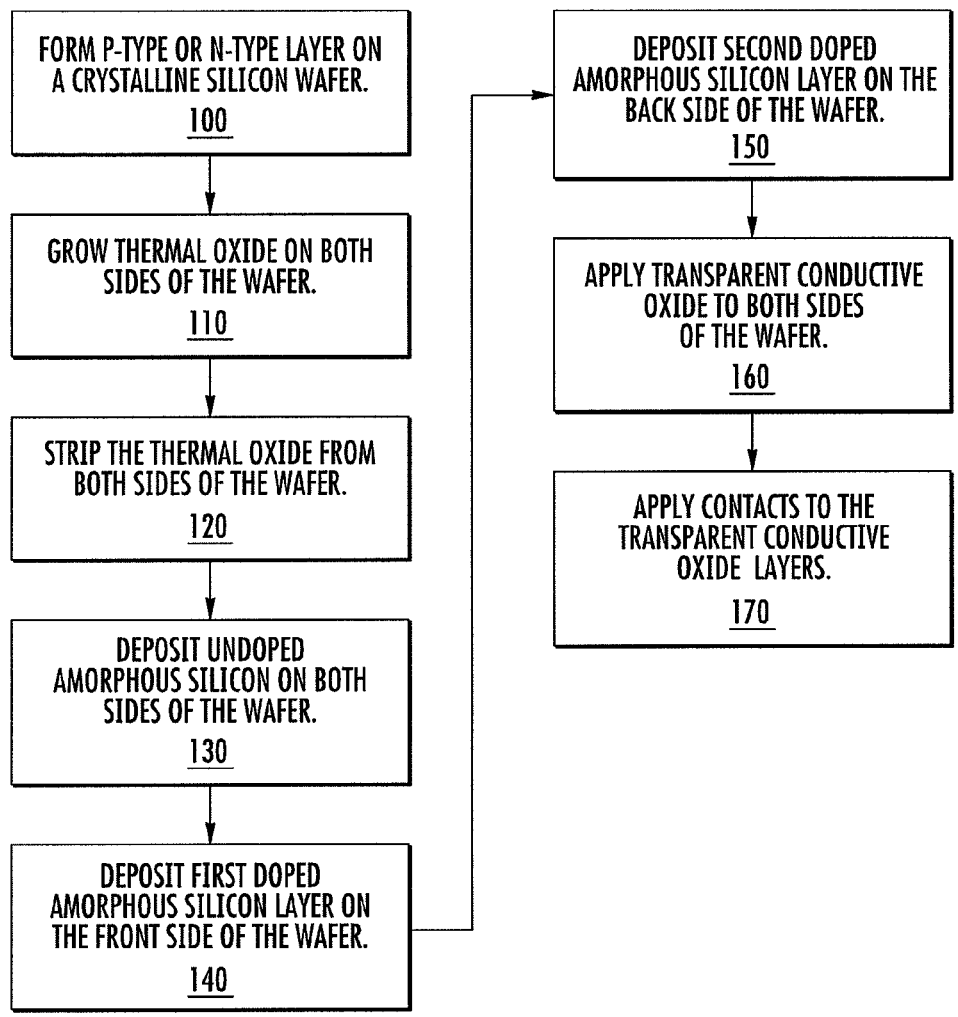
FIG. 2 is a flowchart for one embodiment of a solar cell fabrication process.

FIG. 2 depicts a flowchart of a fabrication process for manufacturing solar cells from thin silicon wafers in accordance with one embodiment of the present invention. For example, the process may be used to fabricate cells from silicon wafers ranging in thickness from 100 micrometers to 150 micrometers, which is relatively thin by present standards. The scope of the invention, however, is not limited to thin solar cells, and may be applied to other devices such as photodiodes or photodetectors, for example. In operation 100, a p-n homojunction is formed on a crystalline silicon wafer having a thickness of between approximately 50 and 500 micrometers. The wafer may be monocrystalline or polycrystalline. The wafer surface may also be textured. For example, a crystalline silicon wafer having a (100) surface can be textured using anisotropic etching to create an array of small four-sided pyramids having faces with (111) crystal orientation. Such a textured surface helps to reduce reflectivity and to trap light in the interior of the solar cell.

Figure 4:
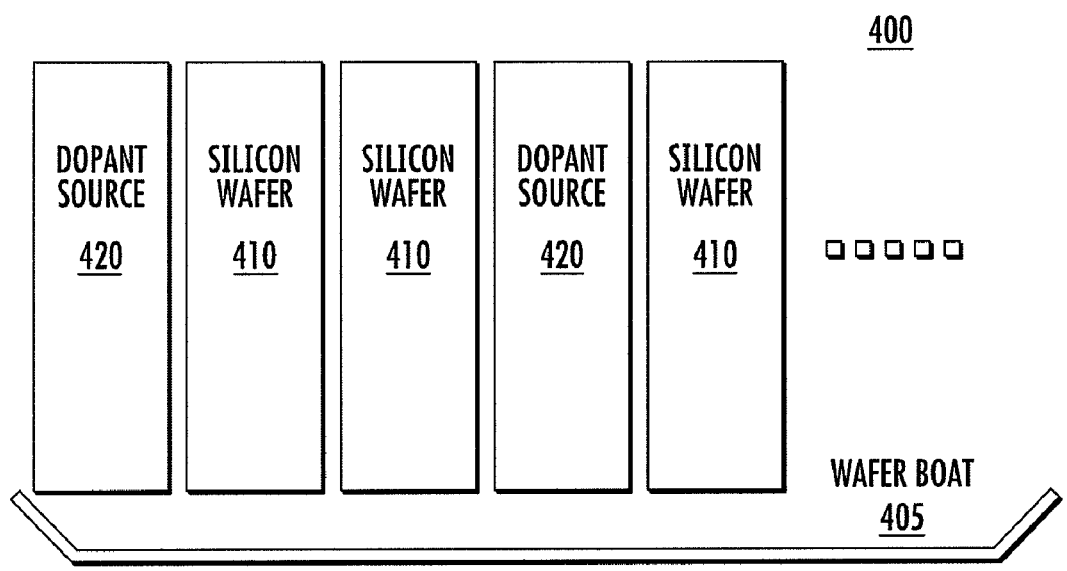
FIG. 4 is an embodiment of a furnace to form a diffused layer to a silicon wafer along with a thin layer of silicon dioxide on all wafer surfaces.

For one embodiment of the invention, an n-type diffused layer is formed on one side of a silicon wafer having a p-type doping. The diffused layer may be formed in a diffusion furnace. FIG. 4 shows an embodiment of a diffusion furnace 400 for doping a plurality of silicon wafers 410. The diffusion furnace comprises wafer boat 405, a plurality of silicon wafers 410, and a plurality of dopant sources 420. The dopant sources 420 have a source of n-type dopant, such as phosphorus, antimony, or arsenic, applied to both surfaces.

The plurality of silicon wafers 410 and the plurality of dopant sources 420 may be placed on the wafer boat 405 in a pattern such that there are two silicon wafers 410 positioned between a first dopant source 420 and a second dopant source 420. For example, FIG. 4 shows a dopant source 420 that is placed on the left most slot of the wafer boat 405. Adjacent to this dopant source 420 is a first silicon wafer 410, which is followed by a second silicon wafer 410, which is in turn followed by a second dopant source 420. If this pattern is continued until the wafer boat 405 is full of dopant sources 420 and silicon wafers 410, each set of two silicon wafers 410 should be sandwiched by a single dopant source 420 on each side. The wafers of FIG. 4 may be spaced approximately 3/32 inch center-to-center. The positioning and spacing of silicon wafers 410 and dopant sources 420 allow one surface layer of each silicon wafer 410 to be doped with impurities from the dopant sources 420.

Once the plurality of silicon wafers 410 and plurality of dopant sources 420 are positioned on the wafer boat, the furnace may be set to a temperature of between approximately 700 and 1000 degrees Celsius to cause dopant molecules to diffuse from each of the dopant sources 420 to a surface of adjacent silicon wafers 410. Note that heating thin silicon wafers to high temperatures over 700 degrees Celsius is generally not beneficial because of the risk of stress induced bowing in the silicon wafers. However, in this case, the entire wafer is heated, rather than subjecting only a portion or surface of the wafer to the heat. Because the temperature gradient across the wafer is minimized, the risk of deformation during diffusion is also minimized, so elevated heating is acceptable at this stage of the process.

This diffusion process may also be used on silicon wafers having n-type doping. For another embodiment of the invention, a p-type diffused layer may be formed on one side of a plurality of n-type silicon wafers. In this embodiment, silicon wafers 410 are doped n-type. The dopant sources 420 are coated with p-type dopants such as boron, gallium, indium, or aluminum. The n-type silicon wafers are then diffused in the diffusion furnace 400.

In the same thermal cycle, but after the diffusion process has completed, the furnace may be injected with oxygen at a flow rate of approximately 3000 standard cubic centimeters per minute to grow an oxide layer on both sides of each silicon wafer in operation 110. After approximately 10 to 30 minutes at a temperature of approximately 900 degrees Celsius, a thermal oxide thickness of five to 20 nanometers is formed on both sides of the wafer. In forming the oxide layer, some of the silicon wafer, which includes any potentially contaminated portion of the surface, is consumed. An oxide layer approximately 10 nanometers thick consumes approximately 4.5 nanometers of silicon from its original surface during its formation. This ensures that the silicon directly beneath the oxide layer is of virgin quality.

Next, the oxide layers are removed from each of the silicon wafers in operation 120. In contrast to traditional methods, a wet chemical cleaning process to remove organic and metallic contamination from the surface of the wafer is not needed for the final etch. Examples of typical wet chemical cleaning processes include solutions of hydrogen peroxide with ammonium hydroxide or hydrochloric acid (RCA clean) and a solution of hydrogen peroxide with sulfuric acid. Such solutions are usually used above room temperature, typically about 80 degrees Celsius. Because the oxide layer has already consumed any potential contaminants, the removal of the oxide layers exposes non-contaminated silicon surfaces. Clean surfaces are critically important in the formation of high quality heterojunctions.

For one embodiment of the invention, the thermal oxide layers are stripped from both wafer surfaces using a dilute hydrofluoric acid (HF) solution. The HF solution may comprise 24 parts water to one part 49% HF by volume. The etch rate of thermal oxide with this solution is approximately eight nanometers per minute. Thus, the etch time for a 20 nanometer oxide layer is between approximately two and three minutes.

The etching of a surface is complete when the surface changes from a hydrophilic state to a hydrophobic state. In other words, if there is still thermal oxide on the silicon surface, water sheets on the surface. Once the oxide layer is stripped from the silicon surface, water balls up on the surface. At this point, the dangling silicon bonds at the wafer surface are terminated by hydrogen atoms, which prepares the silicon for amorphous silicon deposition. No water rinse is used after the etch in order to preserve the condition of the hydrogen-terminated surface. Water rinsing is not needed because the etching solution drains cleanly from the surface by virtue of its hydrophobic state.

Once the oxide layer is removed and the dangling bonds are terminated, an undoped amorphous silicon layer is deposited on both sides of the wafer in operation 130. For one embodiment of the invention, undoped, or intrinsic, amorphous silicon, may be deposited by a hot wire chemical vapor deposition (HWCVD) process. In this process, a wire is heated above the substrate to a temperature of about 2000 degrees Celsius, and a pressure of approximately 10 millitorr may be maintained in the deposition chamber. The wire may be comprised of tantalum or tungsten.

The hot wire decomposes silane molecules. When the molecular fragments make contact with the relatively cold surface of the silicon wafer, the fragments condense and stay on the surface, transitioning from a gas phase to a solid phase. Ideally, the silicon wafer is heated to between approximately 50 and 200 degrees Celsius to provide mobility to silicon atoms to form an amorphous silicon material. It is, however, important to keep the temperature below approximately 400 degrees Celsius to prevent the amorphous silicon from losing passivation properties by crystallizing.

For another embodiment of the invention, the undoped amorphous silicon layer is deposited using a plasma enhanced chemical vapor deposition (PECVD) process. This process also uses silane as a feed gas. The silane gas is decomposed by action of a radio frequency plasma. A frequency range of between approximately 13 and 70 megahertz may be applied to excite the plasma.

For yet another embodiment of the invention, the undoped amorphous silicon layer is deposited by an expanding thermal plasma (ETP) technique.

An undoped amorphous silicon layer is applied to both the front and back surfaces of the silicon. An abrupt interface between amorphous silicon and crystalline silicon will help to reduce the recombination of holes and electrons at the surface of the crystalline silicon. The front and back undoped amorphous silicon layers may be applied sequentially or simultaneously. Each of the undoped amorphous silicon layers has a thickness of approximately two to 10 nanometers. The thickness of the undoped amorphous silicon layer on the front surface of a silicon wafer may be approximately equal to the thickness of the undoped amorphous silicon layer on the back surface. Alternatively, the thickness of the undoped amorphous silicon layer on the front surface of the silicon wafer may be less than the thickness of the undoped amorphous silicon layer on the back surface to avoid excessive absorption of light in the amorphous silicon layer where photogenerated carriers have very low lifetime. Since very little light is absorbed in the back undoped amorphous silicon layer, it can be made thicker to give an improved surface passivation Following deposition of the intrinsic amorphous silicon layers, a first doped amorphous silicon layer is added to the front side of the wafer in operation 140. If the substrate of the silicon wafer is p-type, a doped n-type amorphous silicon layer is deposited to the front, or emitter, side of the wafer. Otherwise, if the substrate of the silicon wafer is n-type, a doped p-type amorphous silicon layer is deposited on the front side of the wafer. The deposition may be done by HWCVD, PECVD, or ETP.

In a HWCVD process, silane and 5% phosphine in hydrogen are applied in the ratio of one part silane to 1.2 parts 5% phosphine in hydrogen at a pressure of approximately 60 millitorr. Moreover, the wafer is held at a temperature in the range of approximately 100 to 300 degrees Celsius. The thickness of the doped amorphous silicon layer may be approximately four to 20 nanometers. It is preferred if the first doped amorphous silicon layer is formed in a different chamber in order to avoid contamination of the chamber used to deposit undoped amorphous silicon.

In operation 150, a second doped amorphous silicon layer is added to the back side of the wafer. This doped amorphous silicon layer has the opposite type from the first doped amorphous silicon layer. Therefore, if the first doped amorphous silicon layer is doped p-type, the second doped amorphous silicon layer is doped n-type, and vice versa. The deposition of the second doped amorphous silicon layer may be applied by HWCVD, PECVD, or ETP.

For HWCVD, silane and 2.5% diborane in hydrogen are applied in the ratio of one part silane to five parts 2.5% diborane in hydrogen at a pressure of approximately 70 millitorr with the wafer held at a temperature of approximately 150 to 350 degrees Celsius. The thickness of the doped amorphous silicon layer grown in this operation may be approximately four to 20 nanometers.

In operation 160, a transparent conductive oxide that has a thickness of approximately 75 nanometers is formed on both sides of the wafer. The transparent conductive oxide layers cover the entire front side and back side of the silicon wafer. The transparent conductive oxide layers are substantially transparent, and have an index of refraction of approximately 2.0. This index of refraction is chosen for the transparent conductive oxide layers in order to provide an appropriate intermediate value between that of air (index of 1.0) and that of silicon (index of approximately 4). The transparent conductive oxide serves as an effective antireflective coating for the solar cell.

The transparent conductive oxide may comprise indium tin oxide. A 90% indium, 10% tin alloy may be evaporated in the presence of oxygen to form an indium tin oxide layer on a wafer held at a temperature of below 250 degrees Celsius. For example, the wafer temperature may be between 150 and 250 degrees Celsius. Such a deposition is performed under vacuum conditions, with a partial pressure of oxygen.

For another embodiment of the invention, the transparent conductive oxide may comprise zinc oxide with aluminum. Other than evaporation, transparent conductive oxide layers, such as zinc oxide and indium tin oxide, may be applied by sputtering. The transparent conductive oxide layers may be applied sequentially or simultaneously.

Finally, contacts are applied to the transparent conductive oxide layers in operation 170. The contacts are grid lines comprising silver. The grid lines may be applied by screen printing, ink jet printing, or evaporation through a shadow mask. A heat treatment of less than 450 degrees Celsius may also be applied for decomposing the printed material, or to promote adherence of the silver lines to the transparent conductive oxide layers.

The silver grid lines do not come in direct contact with the crystalline silicon surface. Application of the contacts to the transparent conductive oxide layers avoids the very high recombination areas on conventional homojunction cells where metals are in direct contact with the crystalline silicon surface.

Figure 3F:
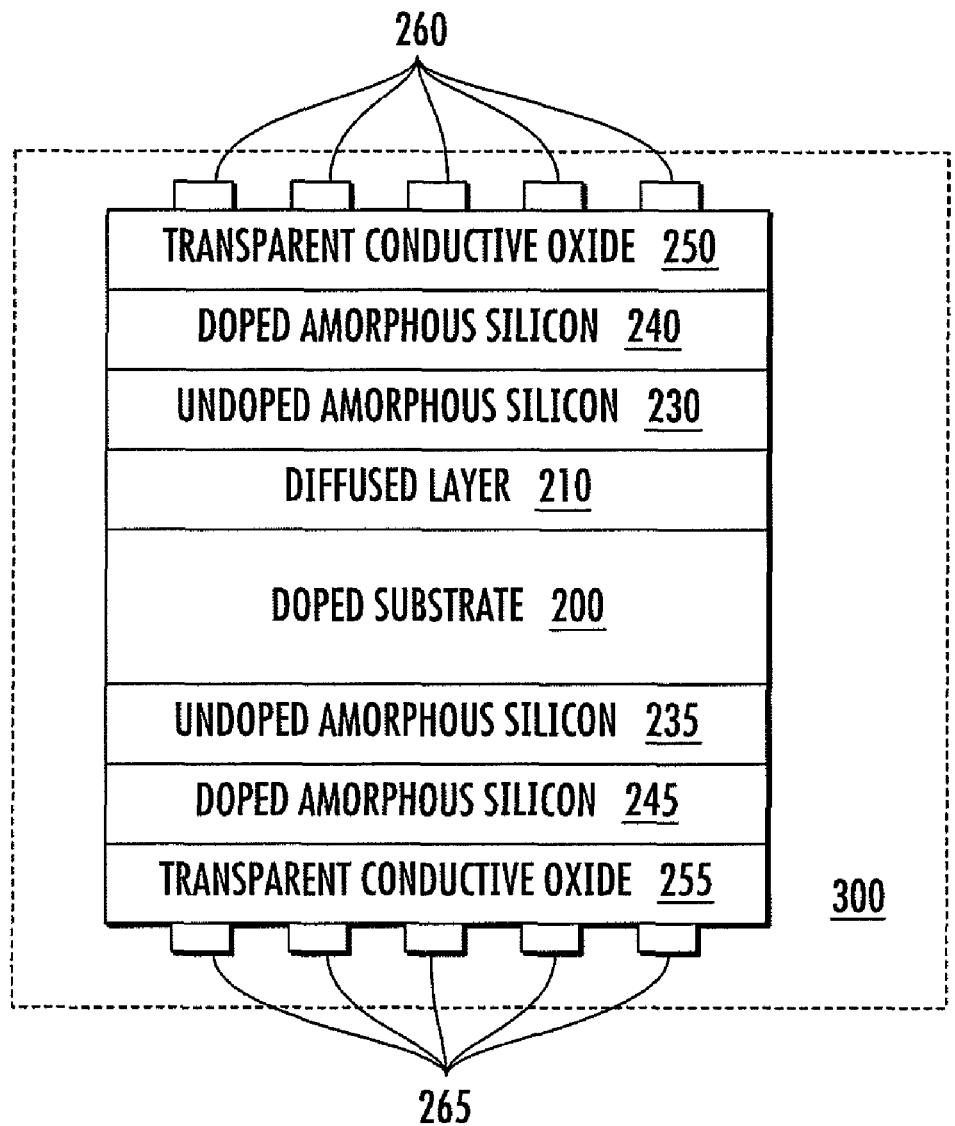

FIGS. 3A through 3F depict cross sectional views for one embodiment of a silicon wafer at various stages in the fabrication process. FIG. 3A comprises a doped substrate 200, a diffused layer 210, a first thermal oxide layer 220, and a second thermal oxide layer 225. The silicon wafer may be monocrystalline silicon or polycrystalline silicon. FIG. 3A shows a silicon wafer following operations 100 and 110, which are described above.

The doped substrate 200 is coupled to the diffused layer 210. The doped substrate 200 may be p-type or n-type. If the substrate 200 is p-type, the diffused layer 210 is n-type. Otherwise, if the substrate 200 is n-type, the diffused layer is p-type. The interface between the doped substrate 200 and diffused layer 210 is a homojunction. The positive fixed charge on the n-side of the homojunction and the negative fixed charge on the p-side of the homojunction create an electric field. The electric field directs the photogenerated electrons to the n-side and the photogenerated holes to the p-side. The homojunction serves to separate a large fraction of the photogenerated carriers, thereby enabling their collection at the contacts.

One thermal oxide layer 220 is grown on the diffused layer 210, and a second thermal oxide layer 225 is grown on the doped substrate 200. The thermal oxide layers 220, 225 are formed to eliminate the costly and time-consuming preparation of the silicon surface by extensive wet chemical cleaning. As explained above, the thermal oxidation process consumes part of the silicon wafer, including any parts of the surface that are contaminated.

Thus, upon removal of the thermal oxide layers 220, 225 in operation 120, the exposed surfaces of the doped substrate 200 and diffused layer 210, as shown in FIG. 3B, are virtually free from contaminants. In addition, the dilute HF solution used to strip the oxide layers 220, 225 supplies hydrogen atoms to temporarily terminate the dangling bonds at the surfaces of the wafer, thereby assisting in passivation of the surfaces by eliminating recombination centers that would otherwise be formed. Recombination centers are disadvantageous because they destroy charge carriers generated by absorption of light and thus reduce a solar cell's efficiency. This temporary passivation becomes permanent when the undoped amorphous silicon layer, which contains a significant amount of atomic hydrogen, is deposited.

FIG. 3C depicts the silicon wafer after an undoped amorphous silicon layer is deposited on both sides of the wafer in operation 130. The wafer comprises a doped substrate 200, a diffused layer 210, a first undoped amorphous silicon layer 230, and a second undoped amorphous silicon layer 235. The first amorphous silicon layer 230 and the second undoped amorphous silicon layer 235 assist in passivation of the surfaces of the crystalline silicon wafer.

FIG. 3D depicts the silicon wafer after a first doped amorphous layer is deposited on the front of the wafer in operation 140. The first doped amorphous silicon layer 240 is coupled to the first undoped amorphous silicon layer 230. The first undoped amorphous silicon layer 230 is coupled to the diffused layer 210. The diffused layer is coupled to the doped substrate 200. The doped substrate 200 is coupled to the undoped amorphous silicon 235.

Similarly, FIG. 3E depicts the silicon wafer after a second doped amorphous silicon layer 245 is deposited on the second side of the wafer in operation 150. More specifically, in addition to the components of FIG. 3D, FIG. 3E comprises a second doped amorphous silicon layer 245 coupled to the second undoped amorphous silicon layer 235. The first doped amorphous silicon layer 240 and second doped amorphous silicon layer 245 supplement the undoped amorphous silicon layers 230, 235 to passivate the top and bottom surfaces of the crystalline silicon wafer. The first doped amorphous silicon layer 240 and diffused layer 210 have the same type, and the second doped amorphous silicon layer 245 and doped substrate 200 have the same type. The first doped amorphous silicon layer 240 and diffused layer 210 have a type that is opposite to the type of the second doped amorphous silicon layer 245 and doped substrate 200. For one embodiment of the invention, the first doped amorphous silicon layer 240 and the diffused layer 210 are p-type, while the second doped amorphous silicon layer 245 and doped substrate 200 are n-type. For another embodiment of the invention, the first doped amorphous silicon layer 240 and the diffused layer 210 are n-type, while the second doped amorphous silicon layer 245 and doped substrate 200 are p-type.

Amorphous silicon layers 240, 230 are coupled to crystalline silicon layer 210 to enable charge to flow between these layers, which creates an effective heterojunction. Further, this heterojunction has an electric field that is in the same direction as the electric field in the homojunction of the crystalline silicon. The electric fields are in the same direction because doped amorphous silicon layer 240 and diffused layer 210 have the same charge type.

Because amorphous silicon layers 245, 235 are coupled to crystalline silicon layers 200, there is a heterojunction at that interface as well. This heterojunction has an electric field that is also in the same direction as the electric field in the homojunction of the crystalline silicon. The electric fields are in the same direction because doped amorphous silicon layer 245 and doped substrate 200 have the same type. Hence, the effective heterojunction acts to supplement and reinforce the action of the homojunction.

The electric fields created by the two heterojunctions act to supplement or reinforce the electric field of the homojunction. The reinforced electric field permits electrons to flow more freely through the solar cell and into an external load coupled to the solar cell.

FIG. 3F depicts a silicon wafer following operations 160 and 170. A first transparent conductive oxide layer 250 is coupled to the first doped amorphous silicon layer 240 and a second transparent conductive oxide layer 255 is coupled to the second doped amorphous silicon layer 245. The transparent conductive oxide layer 250 is coupled to a plurality of contacts 260, and the transparent conductive oxide layer 255 is coupled to a plurality of contacts 265. Solar cell 300 comprises the silicon wafer, the amorphous silicon layers, transparent conductive oxide layer, and contacts. Because the metal contacts the transparent conductive oxide but does not directly contact the crystalline silicon surface, the high surface recombination losses associated with the metal/silicon interface in conventional solar cells is eliminated. The transparent conductive oxide layer 250 serves as an antireflective coating for solar cell 300. The transparent conductive oxide layer 250 may cover the entire front surface of the solar cell 300. Further, transparent conductive oxide layers 250, 255 have sufficiently low sheet resistance to provide a lateral conduction path for current to reach the contacts 260, 265. The sheet resistance of the transparent conductive oxide layers 250, 255 may be in the range of 30 to 100 ohms/square.

Figure 5:
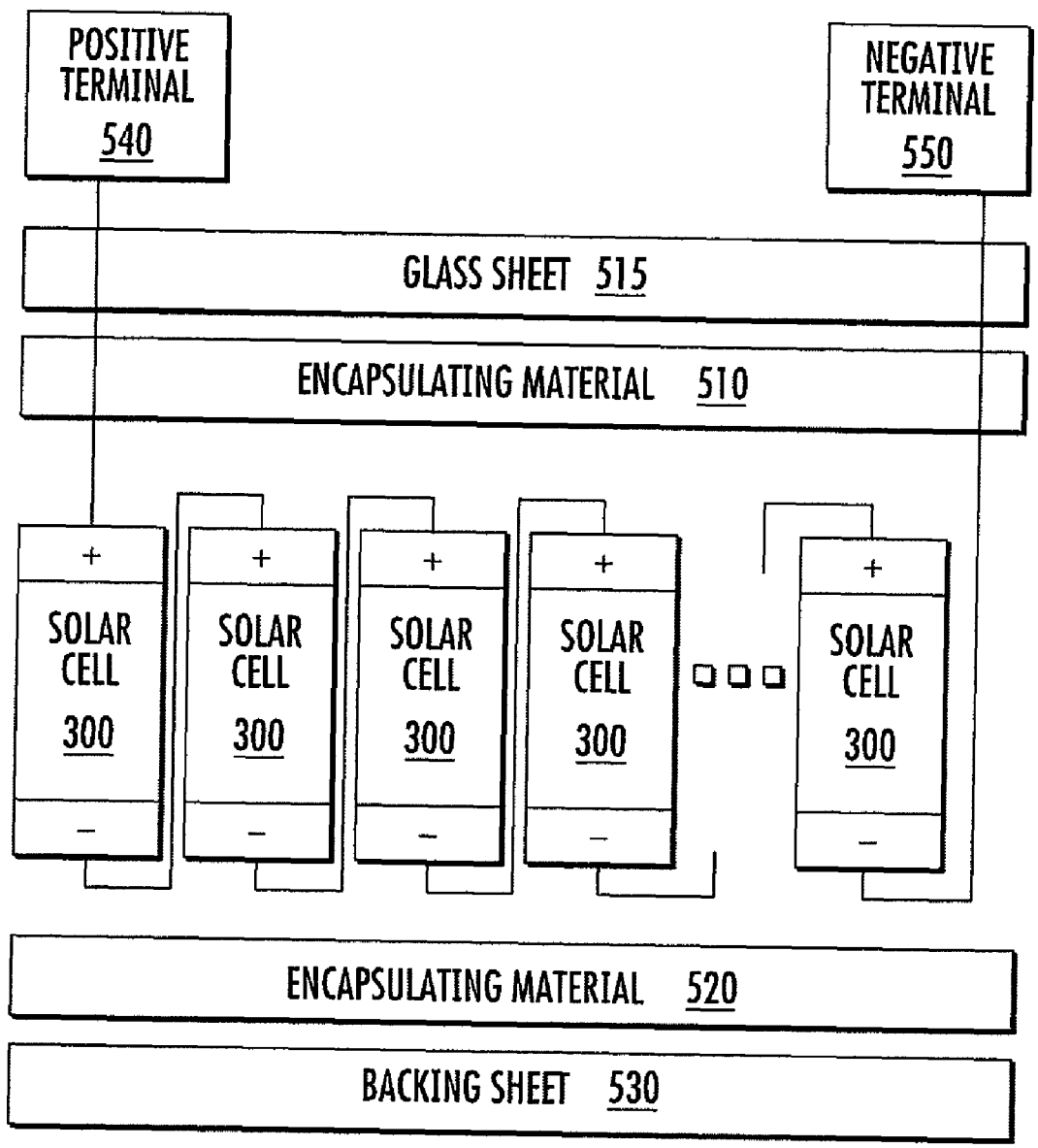
FIG. 5 is a solar module having a plurality of solar cells.

Solar cells produced from a silicon wafer may subsequently be incorporated into solar modules. The solar module depicted in FIG. 5 comprises a plurality of solar cells 300, a first encapsulating material 510, a glass sheet 515, a second encapsulating material 520, a backing sheet 530, a positive terminal 540, and a negative terminal 550.

The solar cells of the solar module are connected in series to build up voltage. Specifically, the solar cells are soldered to one another such that the negative contact of a first solar cell 300 is coupled to the positive contact of a second solar cell 300. The negative contact of the second solar cell 300 is connected to the positive contact of a third solar cell 300. The pattern is continued until all the solar cells 300 of a module are soldered together. By connecting the solar cells in series, the voltage generated by each solar cell 300 is aggregated with the next. For one embodiment of the invention, 36 solar cells are connected in series in a single module. For another embodiment of the invention, 72 solar cells are connected in series in a single module. The positive terminal of the solar module is coupled to the positive contact of the first solar cell 300. The negative terminal of the solar module is coupled to the negative terminal of the negative contact of the last of the plurality of solar cells 300 connected in series.

Encapsulating material 510 is coupled to one side of the plurality of solar cells 300. Encapsulating material 520 is coupled to a second side of the plurality of solar cells 300. The encapsulating materials 510, 520 may comprise a transparent material having a similar index of refraction as glass, such as ethylene vinyl acetate, to allow light to pass to the solar cell 300 and to protect the solar cell 300 from potentially harmful elements and objects.

During the fabrication of the module, the first encapsulating material 510 and the second encapsulating material 520 are squeezed together and heated. The ethylene vinyl acetate melts and flows around the plurality of solar cells 300. The glass sheet 515 is then coupled to the first encapsulating material 510 to further protect the solar cell 300. Because the encapsulating material 510 and glass sheet 515 have substantially the same index of refraction, the two layers have the optical properties of a single layer.

A backing sheet 530 is coupled to the second encapsulating material 520. This backing sheet 530 may comprise a reflective material, such as polyvinyl fluoride. Any light that passes through the glass sheet 515, encapsulating material 510, and is not absorbed by a solar cell 300, exits through encapsulating material 520. The light may then reflect off backing sheet 530 and pass through solar cell 300 a second time, and offer the solar cell 300 a second opportunity to absorb the light.

In the forgoing specification, the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A method, comprising:
  forming a diffused layer on a doped substrate of a thin crystalline silicon wafer in a thermal cycle, wherein the thermal cycle is performed in a furnace, and wherein the conductivity type of the diffused layer is opposite the conductivity type of at least an adjacent portion of the doped substrate thereby forming a p-n homojunction;
  injecting oxygen into the furnace to form a first oxide layer on a first surface of the crystalline silicon wafer proximate the diffused layer and to form a second oxide layer on a second surface of the crystalline silicon wafer opposite the diffused layer in the thermal cycle;
  removing the first and second oxide layers to expose the first and the second surfaces of the crystalline silicon wafer;
  forming a first undoped amorphous silicon layer to the first surface of the crystalline silicon wafer;
  forming a second undoped amorphous silicon layer to the second surface of the crystalline silicon wafer;
  forming a first doped amorphous silicon layer on the first undoped amorphous silicon layer, wherein the conductivity type of the first doped amorphous silicon layer is the same as the conductivity type of the diffused layer; and
  forming a second doped amorphous silicon layer on the second undoped amorphous silicon layer, wherein the conductivity type of the second doped amorphous silicon layer is opposite the conductivity type of the diffused layer.

2. The method of claim 1, wherein the first undoped amorphous silicon layer and the second undoped amorphous silicon layer are formed simultaneously.

3. The method of claim 1, wherein the crystalline silicon wafer has a thickness of between approximately 50 and 500 micrometers.

4. The method of claim 1, wherein the first oxide layer has a thickness that is approximately equal to the second oxide layer.

5. The method of claim 1, wherein the diffused layer is formed on the doped substrate of the crystalline silicon wafer at a temperature range of between approximately 700 and 1000 degrees Celsius.

6. The method of claim 1, wherein a portion of the crystalline silicon wafer is consumed during the forming of the first and second oxide layers.

7. The method of claim 1, wherein the first and second thermal oxide layers are removed without a preparatory wet chemical cleaning process.

8. The method of claim 1, wherein the first and second thermal oxide layers are removed using a hydrofluoric acid (HF) solution.

9. The method of claim 8, wherein the HF solution is comprised of approximately 24 parts water to one part 49% HF by volume.

10. The method of claim 1, wherein a first undoped amorphous silicon layer is formed by decomposing silane by a hot wire chemical vapor deposition (HWCVD) process at a pressure of approximately 10 millitorr, wherein the crystalline silicon wafer is at a temperature of approximately 100 degrees Celsius.

11. The method of claim 10, wherein silane molecules are decomposed in the HWCVD process by a wire heated to approximately 2000 degrees Celsius.

12. The method of claim 1, wherein a first undoped amorphous silicon layer is formed by decomposing silane by a plasma enhanced chemical vapor deposition process, wherein a radio frequency plasma of between approximately 13 and 70 megahertz is applied.

13. The method of claim 1, wherein the first undoped amorphous silicon layer has a thickness of between approximately two and 10 nanometers.

14. The method of claim 1, wherein the diffused layer of the crystalline silicon wafer is p-type, wherein the doped substrate of the crystalline silicon wafer is n-type, wherein the first doped amorphous silicon layer is p-type, wherein the second doped amorphous silicon layer is n-type.

15. The method of claim 1, wherein the diffused layer of the crystalline silicon wafer is n-type, wherein the doped substrate of the crystalline silicon wafer is p-type, wherein the first doped amorphous silicon layer is n-type, wherein the second doped amorphous silicon layer is p-type.

16. The method of claim 1, wherein the first doped amorphous silicon layer is formed by HWCVD using a combination of silane and 5% phosphine in hydrogen, wherein the combination has a ratio of one part silane to 1.2 parts 5% phosphine in hydrogen at a pressure of approximately 60 millitorr, wherein the crystalline silicon wafer is at a temperature of approximately 200 degrees Celsius.

17. The method of claim 1, wherein the second doped amorphous silicon layer is formed by HWCD using a combination of silane and 2.5% diborane in hydrogen, wherein the combination has a ratio of one part silane to five parts 2.5% diborane in hydrogen at a pressure of approximately 70 millitorr, wherein the crystalline silicon wafer is at a temperature of approximately 250 degrees Celsius.

18. The method of claim 1, further comprising:
  forming a first conductive oxide layer on the first doped amorphous silicon layer; and
  forming a second conductive oxide layer on the second doped amorphous silicon layer.

19. The method of claim 18, wherein the first conductive oxide layer is formed by evaporating a 90% indium and 10% tin alloy in the presence of oxygen, wherein the crystalline silicon wafer is at a temperature of approximately 165 degrees Celsius.

20. The method of claim 18, wherein the first conductive oxide layer is formed by sputtering.

21. The method of claim 18, further comprising:
  applying a first plurality of contacts to the first conductive oxide; and
  applying a second plurality of contacts to the second conductive oxide.

22. The method of claim 21, wherein the first and second plurality of contacts are applied by depositing silver at a temperature of less than approximately 400 degrees Celsius.

23. A method, comprising:
  placing a plurality of silicon wafers having a base dopant material on a wafer boat in a furnace at a temperature of between approximately 700 and 1000 degrees Celsius;
  placing a plurality of doped sources on the wafer boat such that two of the plurality of silicon wafers are positioned between every two of the plurality of doped sources, wherein the doped sources diffuse a layer of dopant into a front side of each of the plurality of silicon wafers thereby forming a p-n homojunction;
  injecting oxygen into the furnace to grow a first oxide layer on the front side and a second oxide layer on a back side of each of the plurality of silicon wafers;
  removing the plurality of silicon wafers from the furnace;

stripping the first oxide layer and the second oxide layer using a hydrofluoric acid; and growing a first intrinsic amorphous silicon layer on the front side of each of the plurality of silicon wafers;

growing a second intrinsic amorphous silicon layer on the back side of each of the plurality of silicon wafers;

growing a first doped amorphous silicon layer on the first intrinsic amorphous silicon layer of each of the plurality of silicon wafers, wherein the conductivity type of the first doped amorphous silicon layer is the same as the conductivity type of the diffused layer; and growing a second doped amorphous silicon layer on the second intrinsic amorphous silicon layer of each of the plurality of silicon wafers, wherein the conductivity type of the second doped amorphous silicon layer is opposite the conductivity type of the diffused layer.

24. The method of claim 23, wherein each of the plurality of silicon wafers is spaced approximately 3/32 inch from an adjacent doped source.

25. The method of claim 23, wherein each of the plurality of silicon wafers is spaced approximately 3/16 inch from an adjacent silicon wafer.

26. The method of claim 23, wherein each of the plurality of silicon wafers has a thickness of less than 200 micrometers.

27. The method of claim 23, wherein the plurality of silicon wafers are n-type, wherein the plurality of doped sources are p-type, wherein the first doped amorphous silicon layer of each of the plurality of silicon wafers is p-type, wherein the second doped amorphous silicon layer of each of the plurality of silicon wafers is n-type.

28. The method of claim 23, wherein the plurality of silicon wafers are p-type, wherein the plurality of doped sources are n-type, wherein the first doped amorphous silicon layer of each of the plurality of silicon wafers is n-type, wherein the second doped amorphous silicon layer of each of the plurality of silicon wafers is p-type.

* * * * *